(12) United States Patent
Penzes et al.

(10) Patent No.: US 8,739,104 B1
(45) Date of Patent: May 27, 2014

(54) SYSTEMS AND METHODS FOR FORMING AN INTEGRATED CIRCUIT USING A STANDARD CELL LIBRARY

(71) Applicant: Broadcom Corporation, Irvine, CA (US)

(72) Inventors: Paul Ivan Penzes, Irvine, CA (US); Ardavan Moassessi, Laguna Niguel, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/781,468

(22) Filed: Feb. 28, 2013

(51) Int. Cl.
*G06F 17/50* (2006.01)

(52) U.S. Cl.
USPC .............................. 716/122; 716/118; 716/119

(58) Field of Classification Search
USPC ......... 716/110, 118–119, 122, 132, 135, 126, 716/129–130, 133
See application file for complete search history.

(56) References Cited

U.S. PATENT DOCUMENTS

| 8,549,455 | B2 * | 10/2013 | Quandt et al. | 716/119 |
| 8,561,003 | B2 * | 10/2013 | Kawa et al. | 716/132 |
| 2004/0102497 | A1 * | 5/2004 | Gu et al. | 514/374 |

* cited by examiner

*Primary Examiner* — Stacy Whitmore
(74) *Attorney, Agent, or Firm* — McDermott Will & Emery LLP

(57) ABSTRACT

System and methods for forming an integrated circuit using a standard cell library are provided. In some aspects, a method includes arranging cells from the standard cell library into a row between upper and lower power rails. Each cell includes a plurality of lateral nodes, at least one boundary region, and at least one dummy transistor. The method includes identifying a connection pattern of adjacent ones of the cells. The connection pattern is between (i) the lateral nodes of the adjacent cells and (ii) the upper and lower power rails. The method includes removing adjacent boundary regions of the adjacent cells based on the identified connection pattern of the adjacent cells, and modifying an arrangement of adjacent dummy transistors of the adjacent cells based on the removal of the adjacent boundary regions.

21 Claims, 13 Drawing Sheets

Lateral edge node connected to power rail

Lateral edge node not connected to power rail

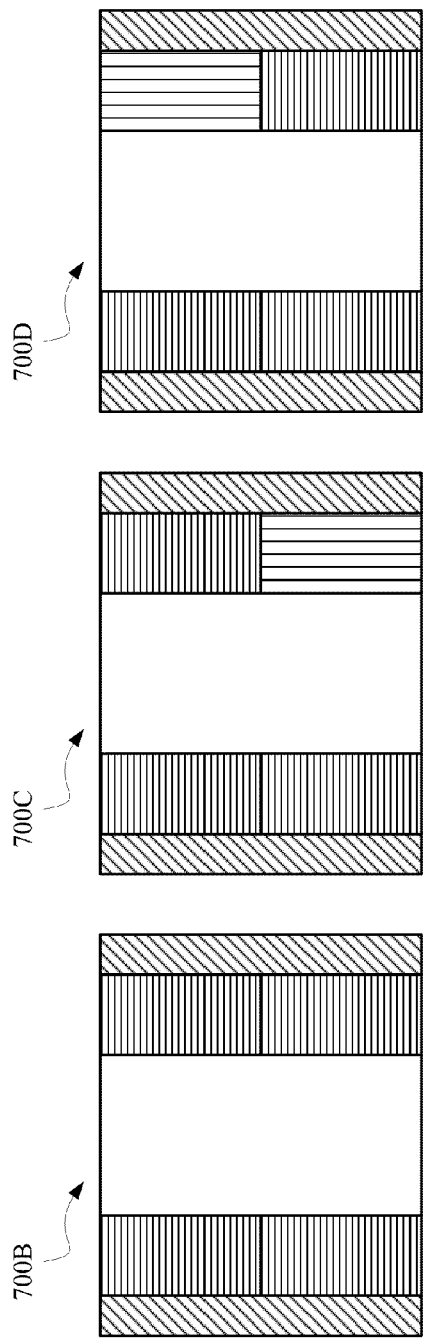
FIG. 7B
FIG. 7C
FIG. 7D
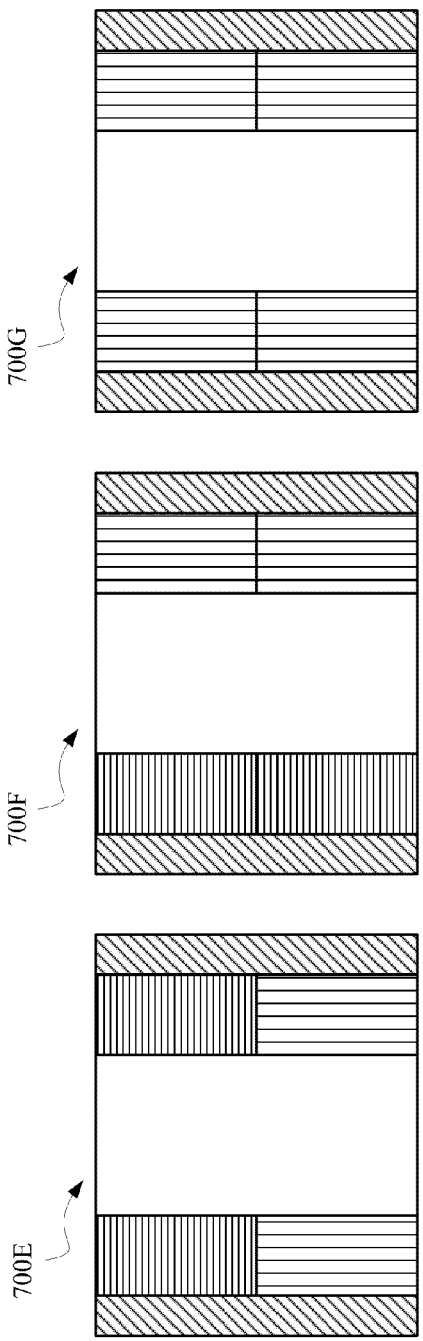
FIG. 7E
FIG. 7F
FIG. 7G

SYSTEMS AND METHODS FOR FORMING AN INTEGRATED CIRCUIT USING A STANDARD CELL LIBRARY

FIELD

The subject technology generally relates to integrated circuits, and, in particular, relates to systems and methods for forming an integrated circuit using a standard cell library.

BACKGROUND

Technology scaling has led to the development of fin-based metal-oxide-semiconductor field-effect transistor (MOSFET) structures as an alternative to the bulk-Silicon (or bulk-Si) MOSFET structure for improved scalability. The fin-based MOSFET (finFET) includes a silicon fin that forms the body of the transistor. The gate electrode of the transistor is orthogonal to the fin, and includes a portion that straddles or surrounds the fin. During operation, current flows between the source and drain electrodes of the transistor along the gated sidewall surfaces of the fin.

BRIEF DESCRIPTION OF THE DRAWINGS

The accompanying drawings, which are included to provide further understanding of the subject technology and are incorporated in and constitute a part of this specification, illustrate aspects of the subject technology and together with the description serve to explain the principles of the subject technology.

FIGS. 7A, 7B, 7C, 7D, 7E, 7F, 7G, 7H, 7I, and 7J illustrate examples of cells with different topologies that indicate which lateral nodes of the cells are connected to corresponding power rails, in accordance with various aspects of the subject technology.

DETAILED DESCRIPTION

In the following detailed description, numerous specific details are set forth to provide a full understanding of the subject technology. It will be apparent, however, that the subject technology may be practiced without some of these specific details. In other instances, structures and techniques have not been shown in detail so as not to obscure the subject technology.

An integrated circuit can be designed from a standard cell library having cells each formed from fin-based metal-oxide-semiconductor field-effect transistors (finFETs). In these cells, for example, the gate electrodes of the finFETs run vertically and the fins of the finFETs run horizontally. As a result of this orthogonal layout, the cells may be conveniently placed adjacent to one another in rows and columns, with power rails provided above and below each row to supply power to the cells in between the power rails. However, because of design rules, space may need to be allocated between adjacent cells so that the operation of one of the cells does not affect the operation of the other cell. The added space between the adjacent cells may increase the size of the integrated circuit, thereby also increasing the cost of forming the integrated circuit. Larger circuits, for example, may consume more power and may be slower than smaller circuits. According to various aspects of the subject technology, systems and methods are provided for optimizing the size of an integrated circuit by minimizing the size of adjacent cells used to form the integrated circuit.

Figure 1:
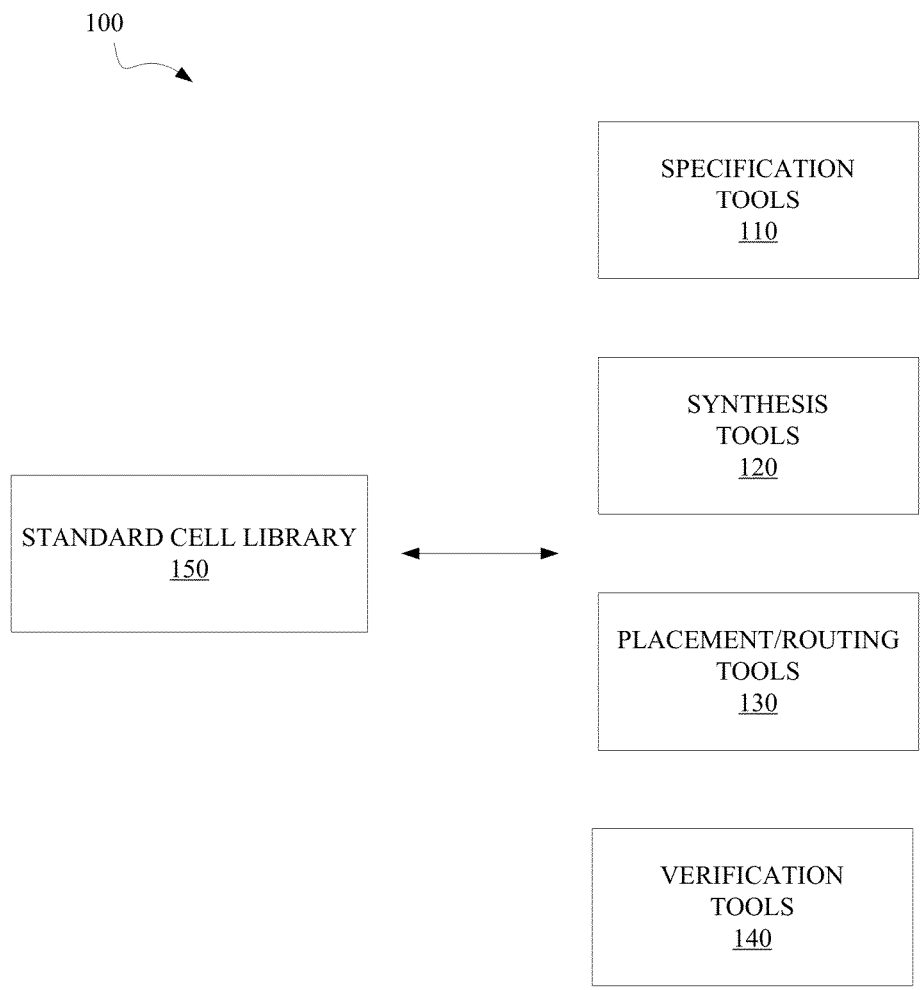
FIG. 1 illustrates an example of a design environment used in the design of integrated circuits, in accordance with various aspects of the subject technology.

FIG. 1 illustrates an example of design environment 100 used in the design of integrated circuits, in accordance with various aspects of the subject technology. Design environment 100 includes specification tools 110, synthesis tools 120, placement/routing tools 130, and verification tools 140. During the design process, the functionality of the chip is specified in specification tool 110 using a standard hardware programming language such as Verilog. The resulting circuit description is synthesized/mapped into the basic gates of standard cell library 150, using one or more synthesis tools 120. The resulting gate netlist is then placed and routed using placement/routing tools 130. Finally, the connectivity and functionality of the integrated circuit are verified using a verification tool 140.

While each of these components is important for the final quality of the resulting integrated circuit, the quality of implementation achievable by most of these components is design dependent. For example, a good Verilog code specifying circuit A, does not make an independent circuit B any better. However, an adequate standard cell library makes all designs better. The quality of the standard cell library influences all designs and, as such, has a far reaching influence on the quality of the resulting integrated circuit chip.

Figure 2:
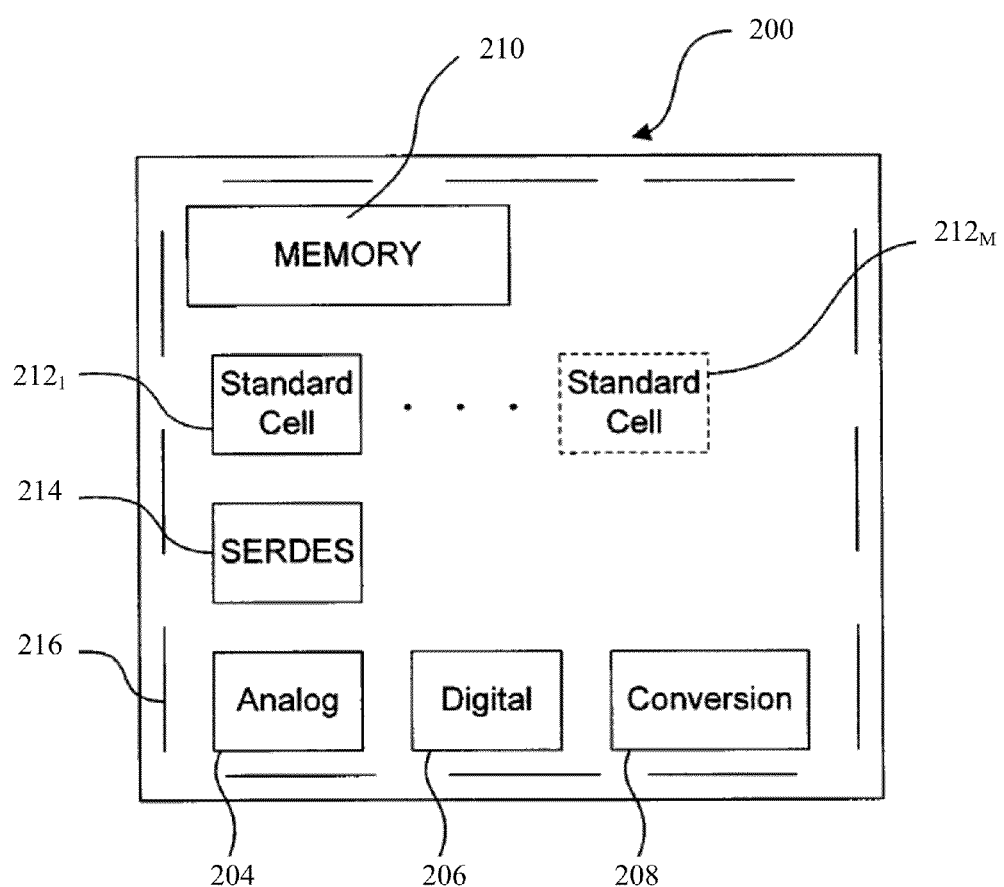
FIG. 2 illustrates an example of an integrated circuit, in accordance with various aspects of the subject technology.

FIG. 2 illustrates an example of integrated circuit 200, in accordance with various aspects of the subject technology. Integrated circuit 200 includes analog portion 204, digital portion 206, conversion portion 208 (e.g., analog-to-digital and/or digital-to-analog conversions), memory 210, and standard cells $212_1$-$212_M$. Optionally, integrated circuit 200 includes a SERDES portion 214, which is a serial-deserializer device that converts input serial data to deserialized parallel data for use by the other portions of integrated circuit 200.

According to some implementations, elements 204-214 can be proprietary or manufacturer specific, with the normal exception of the standard cells $212_1$-$212_M$. Standard cells $212_1$-$212_M$ can vary in size based on a size and/or number of devices thereon (e.g., a size of logic devices thereon (sometimes referred to as gates, and used interchangeably below) or a number of logic devices thereon) to provide an optimal combination of size, signal propagation speed, and/or leakage. Each of standard cells $212_1$-$212_M$ may be designed to perform a specific function or set of functions or processes on a propagating signal. These functions can be represented by combinations of transistors forming various logic gates, as discussed in more detail below.

Standard cell library 150 (e.g., as shown in FIG. 1) may include hundreds of standard cells, where standard cells $212_1$-

$212_1$-$212_M$ are a subset of standard cell library 150 and are selectively combined to design a larger circuit. Each of standard cells $212_1$-$212_M$ in the library may be associated with a specific logic function. Each logic function may be implemented in one or more predefined cells. For example, a logic function may have multiple layouts, each having different characteristics (e.g., timing characteristics).

Each of standard cells $212_1$-$212_M$ in standard cell library 150 can be laid out relative to a grid defined by horizontal and vertical tracks. According to some implementations, the number of horizontal tracks defines the height of the cell and the number of vertical tracks defines the width of the cell. Standard cell library 150 can be generally classified by its track height. For example, a 10-track library is composed of cells having heights of 10 horizontal tracks (or an integer multiple thereof). The widths of cells in a library may also vary. As such, the track height may be determined based on a desired amount of active area, clearance area, design rule check (DRC) constraints and performance requirements. Standard cells that have different track heights may not be combined by abutting their respective power and ground rails because of the difference in alignment. Standard cells $212_1$-$212_M$ may have the same track height (or integer multiple of that height). A standard cell may also include spacer regions on at least opposite sides of the standard cell. These spacer regions, for example, may provide a buffer between the standard cell and another adjacent standard cell.

The type and number of cells added to standard cell library 150 may be dependent upon the efficiency required for the synthesis tool or application. Adding too many cells to standard cell library 150 may significantly reduce the efficiency of the synthesis tool and the quality of the resulting integrated circuit. This is because the synthesis tool may have difficulty handling a large number of choices. Accordingly, multi-threshold voltage cells may only be provided for the most used logic functions. Commonly used functions include, but are not limited to, AND gates, NAND gates, inverters, OR gates, NOR gates, and flip flops. The type of logic function implemented may be arbitrary or design dependent. As design tools become more sophisticated, standard cell library 150 can be further extended to include more complex combinational logic cells for a majority or all supported logic functions.

Figure 3:
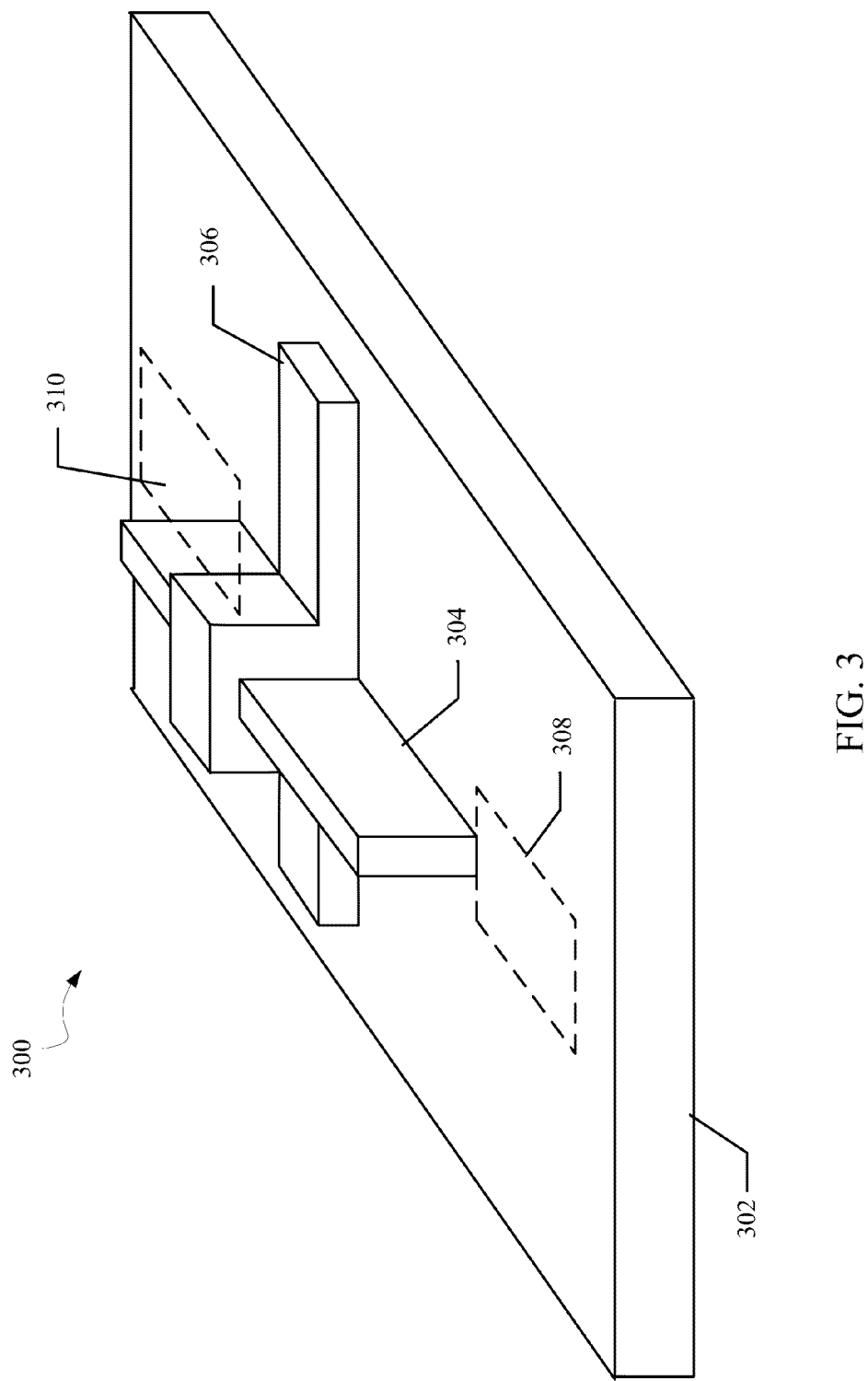
FIG. 3 illustrates a perspective view of a fin-based multi-gate transistor for use in the standard cell illustrated in FIG. 2, in accordance with various aspects of the subject technology.

FIG. 3 illustrates a perspective view of a fin-based multi-gate transistor 300 for use in the standard cells illustrated in FIG. 2, in accordance with various aspects of the subject technology. Fin-based multi-gate transistor 300 includes non-conductive substrate 302 supporting diffusion fin or semiconductor fin 304. Gate structure 306 is deposited over a portion of semiconductor fin 304 to form a gated channel between source 308 and drain 310. In effect, gate structure 306 straddles semiconductor fin 304. During operation, current flows between source 308 and drain 310 along the gated sidewall surfaces of semiconductor fin 304.

According to some implementations, gate structure 306 is formed using a polysilicon material or a metal. Fin-based multi-gate transistor 300 may be applicable to various technologies, including but not limited to, complementary metal-oxide-semiconductor (CMOS), silicon-on-insulator (SOI), Gallium-Arsenide (GaAs), and Silicon-Germanium (SiGe). In addition, fin-based multi-gate transistor 300 may be applicable to double-gate transistors, tri-gate transistors, all-around-gate transistors, and various other implementations of semiconductor devices with quantification.

According to some implementations, an integrated circuit is formed using multiple semiconductor fins along an axis that is orthogonal with gate structures (or polysilicon layers) running parallel to one another across the integrated circuit. The intersection of semiconductor fin 304 and gate structure 306 over an active material deposited on substrate 302 forms a transistor. As such, the integrated circuit can be arranged as a grid where multiple grid points represent this intersection. Accordingly, each transistor can be located at a corresponding grid point of the integrated circuit based on the spatial relationship between semiconductor fin 304 and gate structure 306. The spacing between the multiple semiconductor fins defines a fin pitch. Similarly, the spacing between the gate structures defines a gate pitch. Fin-based multi-gate transistor 300 is not limited to the implementation shown in FIG. 3, and can be implemented with various configurations and structures.

Figure 4A:
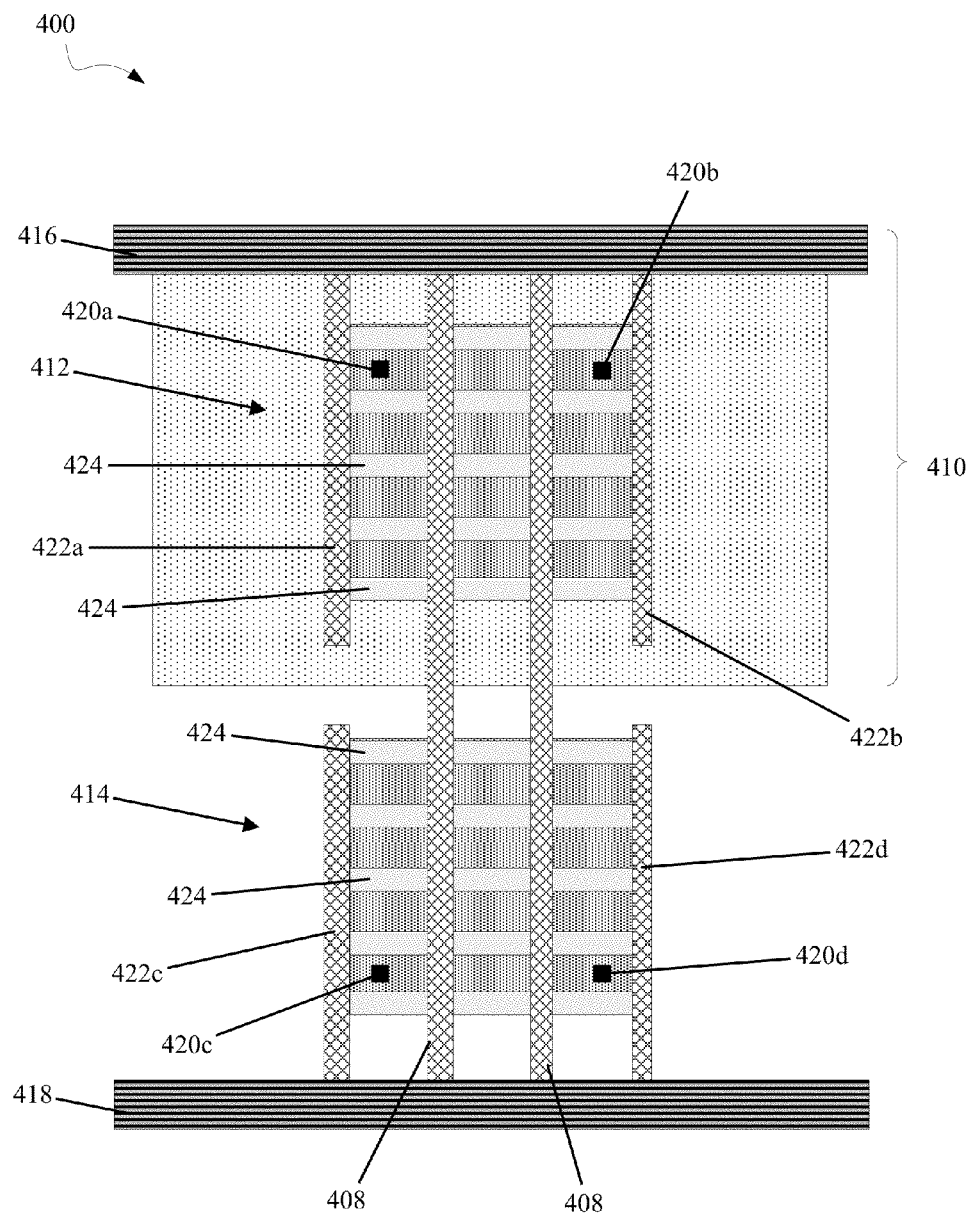
FIGS. 4A, 4B, and 4C illustrate examples of a cell that may be used to form an integrated circuit, in accordance with various aspects of the subject technology.

FIG. 4A illustrates an example of cell 400 that may be used to form an integrated circuit, in accordance with various aspects of the subject technology. In one or more implementations, standard cell library 150 (e.g., as shown in FIG. 1) for designing an integrated circuit includes cell 400. After cell 400 is laid out in the design, for example, cell 400 may be placed between upper power rail 416 (e.g., $V_{dd}$) and lower power rail 418 (e.g., ground). Cell 400 can have transistors of different types. For example, cell 400 can have p-type transistors 412 and n-type transistors 414. According to some implementations, the transistors are fin-based metal-oxide-semiconductor field-effect transistors (finFETs). In this regard, the finFETs provide for polysilicon 408 (or gate structures) to intersect with semiconductor fins 424 over N-WELL portion 410 to form p-type transistors 412. Similarly, polysilicon 408 intersects with semiconductor fins 424 over another active material (e.g., P-WELL) to form n-type transistors 414. As such, cell 400 is composed of p-type transistors 412 and n-type transistors 414. However, according to one or more implementations, cell 400 may be composed of only p-type transistors 412 or only n-type transistors 414.

Cell 400 also includes lateral nodes. These nodes, for example, may be source or drain electrodes closest to the lateral edges of cell 400, and may be used for input or output functionality or may be used to connect a corresponding transistor to a power rail (e.g., either upper power rail 416 or lower power rail 418). As shown in FIG. 4A, the lateral nodes of cell 400 includes upper left node 420a, upper right node 420b, lower left node 420c, and lower right node 420d.

Because finFET processes utilize aggressive stress engineering, the designs of the cells typically require that the lateral edges of each diffusion region be terminated with "dummy" transistors. Without the dummy transistors, the finFETs closest to the lateral edges may have a significantly degraded performance (e.g., reduced $I_{dsat}$). Furthermore, the degraded performance may also affect finFETs several transistors away.

By adding dummy transistors to the lateral edges of each diffusion region, the stress degradation can be contained. For example, cell 400 includes upper left dummy transistor 422a, upper right dummy transistor 422b, lower left dummy transistor 422c, and lower right dummy transistor 422d. Upper left dummy transistor 422a and upper right dummy transistor 422b may be p-type transistors and may be peripheral to lateral nodes 420a and 420b, respectively. Lower left dummy transistor 422c and lower right dummy transistor 422d may be n-type transistors and may be peripheral to lateral nodes 420c and 420d, respectively.

However, if the dummy transistors are left floating, a short may potentially occur between the lateral nodes of cell 400 and the lateral nodes of an adjacent cell (not shown). Thus, the dummy transistors of a cell are preferably connected to the power rails in order to keep them in an off state. (e.g., p-type transistors are connected to $V_{dd}$ while n-type transistors are connected to ground). However, because of how gate structures are typically cut to avoid connections to other cells, it may not be convenient to directly connect the dummy transistors to the power rails.

Figure 4B:
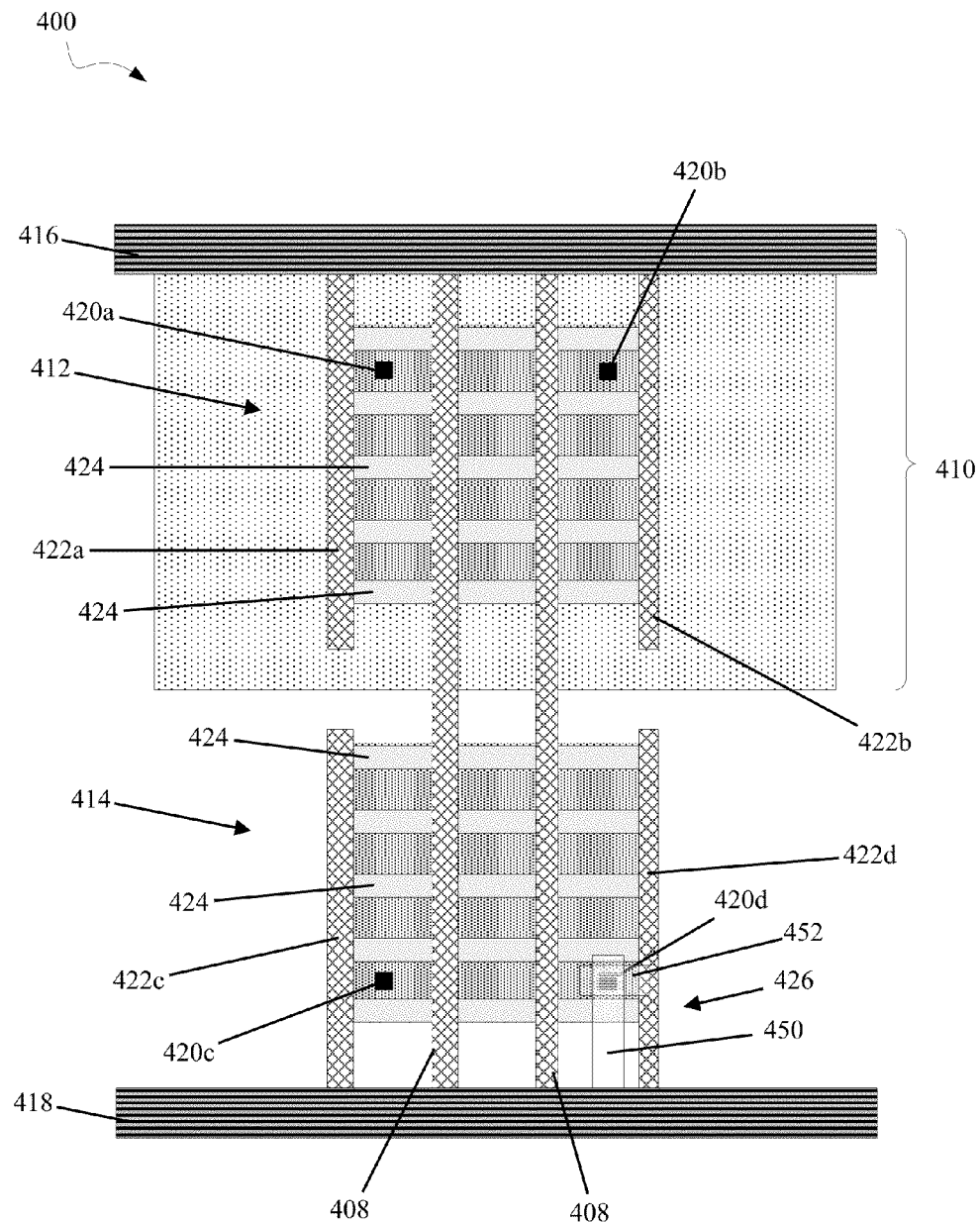

One approach to connecting the dummy transistors to the power rails is to connect the dummy transistors to lateral nodes that are already connected to the power rails. In one or more implementations, the dummy transistors may connect to the power rails using middle-of-line (MOL) layer connections with lateral nodes. FIG. 4B illustrates an example of lower right dummy transistor 422d connecting to lower power rail 418 using MOL layer connection 426 with lower right node 420d, in accordance with various aspects of the subject technology. MOL layer connection 426 includes first connector 450 that makes contact with lower right node 420d and lower power rail 418 in order to connect lower right node 420d to lower power rail 418. MOL layer connection 426 also includes second connector 452 that makes contact with first connector 450 and lower right dummy transistor 422d. Thus, lower right dummy transistor 422d is also connected to lower power rail 418 using the connection between lower right node 420d and lower power rail 418 (e.g., via first connector 450).

However, if the lateral nodes are not already connected to the power rails (e.g., these nodes are used for input or output functionality), the MOL layer connection approach using the lateral nodes may not allow the dummy transistors to connect to the power rails. Thus, in accordance with various aspects of the subject technology, boundary regions may be added to cell edges to provide space for MOL layer connections.

Figure 4C:
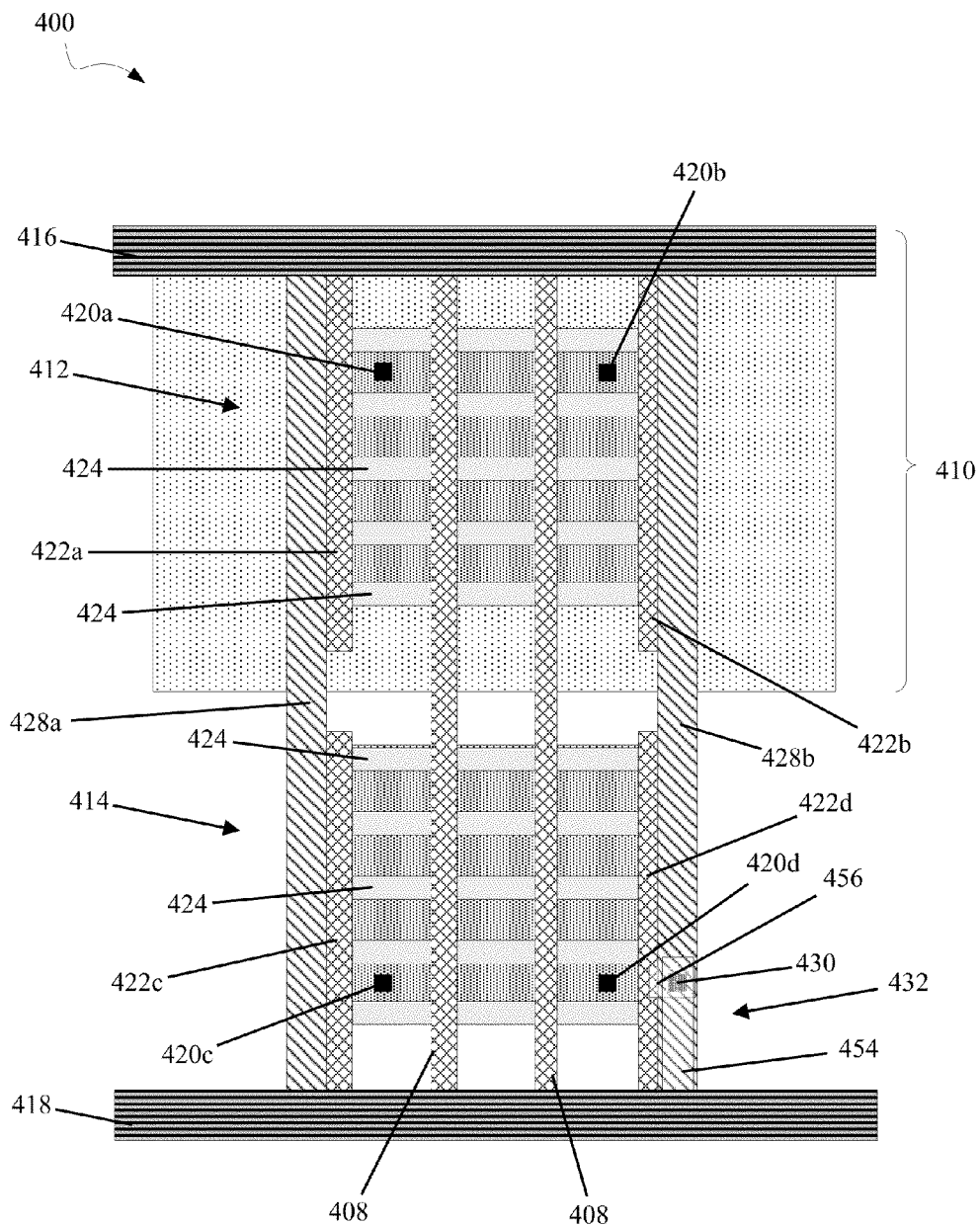

FIG. 4C illustrates an example of boundary regions 428a and 428b added to the lateral edges of cell 400 to provide space for MOL layer connections, in accordance with various aspects of the subject technology. As shown in FIG. 4C, boundary region 428a is a left spacer region that is adjacent and peripheral to the left lateral nodes of cell 400 (e.g., upper left node 420a and lower left node 420c). Furthermore, boundary region 428b is a right spacer region that is adjacent and peripheral to the right lateral nodes of cell 400 (e.g., upper right node 420b and lower right node 420d). Boundary regions 428a and 428b, for example, may each have a width that is half of a pitch between adjacent gate electrodes of cell 400 (e.g., polysilicon 408). The dummy transistors may be disposed between boundary regions 428a and 428b and the corresponding lateral nodes (e.g., upper right dummy transistor 422b is disposed between boundary region 428b and lateral node 420b, lower right dummy transistor 422d is disposed between boundary region 428b and lateral node 420d, upper left dummy transistor 422a is disposed between boundary region 428a and lateral node 420a, and lower left dummy transistor 422c is disposed between boundary region 428a and lateral node 420c). Since the lateral nodes may not necessarily be connected to the power rails, boundary regions 428a and 428b may include nodes that can provide MOL layer connections to corresponding dummy transistors.

For example, as shown in FIG. 4C, right spacer region 428b provides space for MOL layer connection 432 to connect lower right dummy transistor 422d to lower power rail 418, which may require an adjacent cell to provide a similar spacer region for additional space between cell 400 and the adjacent cell. Node 430 may be disposed in right spacer region 428b. MOL layer connection 432 includes first connector 454 that makes contact with node 430 and lower power rail 418 in order to connect node 430 to lower power rail 418. MOL layer connection 432 also includes second connector 456 that makes contact with first connector 454 and lower right dummy transistor 422d. Thus, lower right dummy transistor 422d is also connected to lower power rail 418 using the connection between node 430 and lower power rail 418 (e.g., via first connector 454). However, providing boundary regions 428a and 428b in all cells in this manner may undesirably increase the overall size of the integrated circuit.

According to various aspects of the subject technology, a method is provided for identifying adjacent cells having boundary regions between them that can be removed, thereby reducing the size of the integrated circuit. These boundary regions can be removed, for example, when at least one lateral node from either of the adjacent cells can provide, for the adjacent dummy transistors of these cells, a MOL layer connection to a corresponding power rail. Using the MOL layer connection, the adjacent dummy transistors can be merged together and connected to the power rails in order to provide isolation for both cells. By removing the adjacent boundary regions and merging the dummy transistors, the collective width of both of these cells may be reduced.

Figure 5:
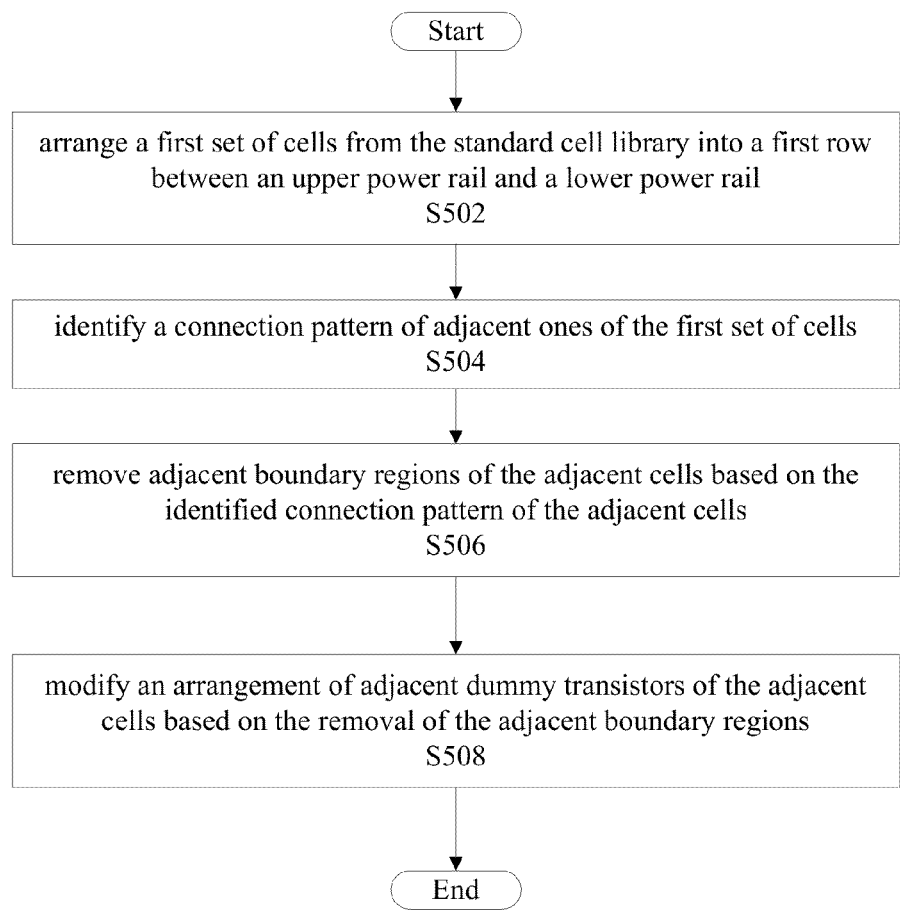
FIG. 5 illustrates an example of a method for forming an integrated circuit using a standard cell library, in accordance with various aspects of the subject technology.

FIG. 5 illustrates an example of method 500 for forming an integrated circuit using a standard cell library, in accordance with various aspects of the subject technology. For example, method 500 may be used to form an integrated circuit using cells from standard cell library 150 (e.g., shown in FIG. 1.). In some aspects, method 500 allows for the formation of the integrated circuit while minimizing the use of boundary regions. Method 500 is not limited to the order illustrated in FIG. 5, and can be performed, executed, or processed in a different order that is capable of forming the integrated circuit while minimizing the use of boundary regions.

Figure 6A:
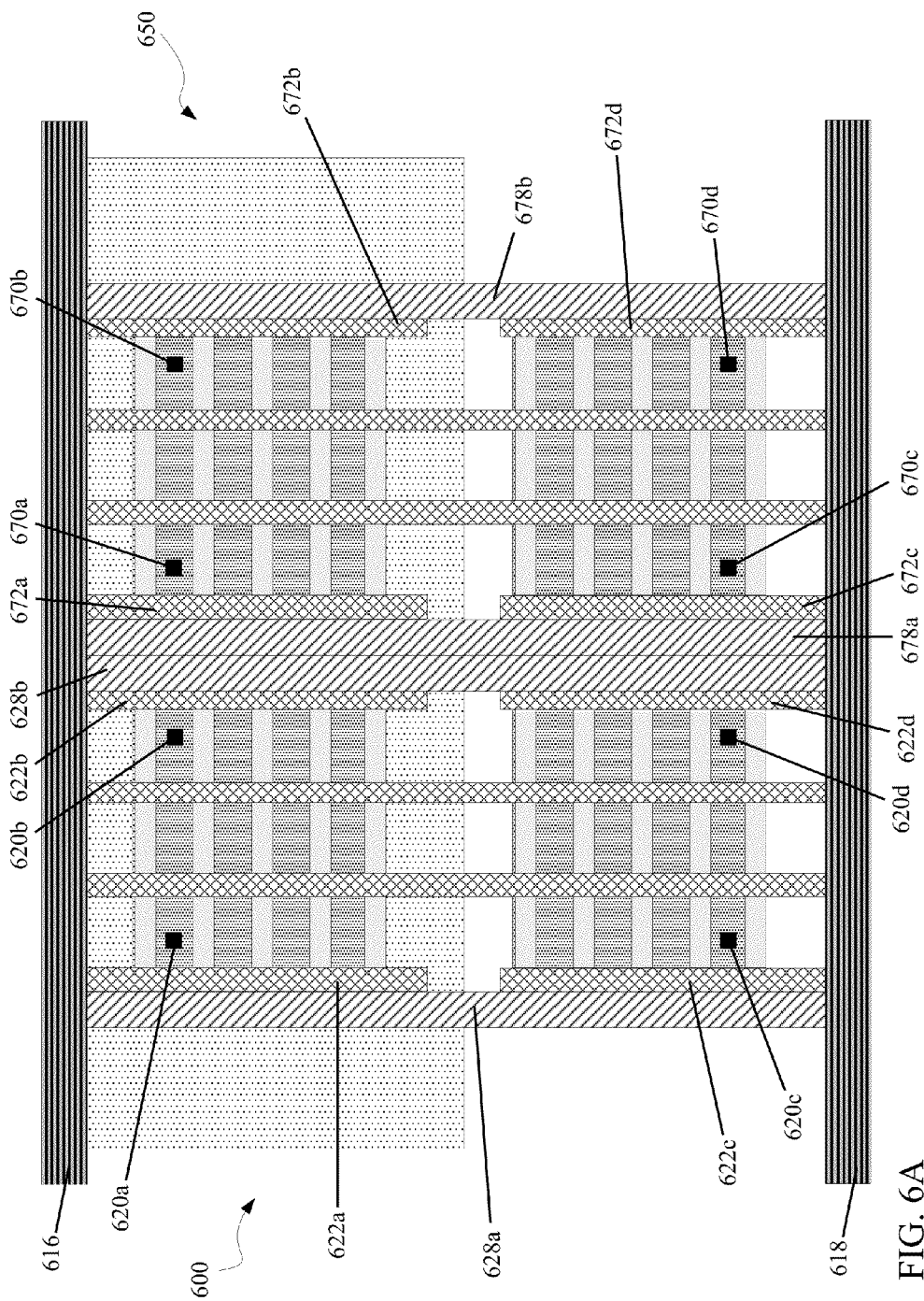
FIGS. 6A and 6B illustrate examples of adjacent cells arranged in a row between an upper power rail and a lower power rail, in accordance with various aspects of the subject technology.

Method 500 includes arranging a first set of cells from the standard cell library into a first row between an upper power rail and a lower power rail (S502). FIG. 6A illustrates an example of adjacent cells 600 and 650 arranged in a row between upper power rail 616 and lower power rail 618, in accordance with various aspects of the subject technology. Each of cells 600 and 650 is similar to cell 400 (e.g., in FIG. 4C). For example, cell 600 includes upper left node 620a, upper right node 620b, lower left node 620c, lower right node 620d, right spacer region 628b adjacent and peripheral to upper right node 620b and lower right node 620d, left spacer region 628a adjacent and peripheral to upper left node 620a and lower left node 620c, upper left dummy transistor 622a disposed between left spacer region 628a and upper left node 620a, upper right dummy transistor 622b disposed between right spacer region 628b and upper right node 620b, lower left dummy transistor 622c disposed between left spacer region 628a and lower left node 620c, and lower right dummy transistor 622d disposed between right spacer region 628b and lower right node 620d.

Similarly, cell 650 includes upper left node 670a, upper right node 670b, lower left node 670c, lower right node 670d, right spacer region 678b adjacent and peripheral to upper right node 670b and lower right node 670d, left spacer region 678a adjacent and peripheral to upper left node 670a and lower left node 670c, upper left dummy transistor 672a disposed between left spacer region 678a and upper left node 670a, upper right dummy transistor 672b disposed between right spacer region 678b and upper right node 670b, lower left dummy transistor 672c disposed between left spacer region 678a and lower left node 670c, and lower right dummy transistor 672d disposed between right spacer region 678b and lower right node 670d.

Although only two cells are shown in FIG. 6A, it is understood that the subject technology can include any number of cells arranged in a row. As shown in FIG. 6A, cell 600 is adjacent to cell 650. In this regard, right spacer region 628b of cell 600 directly abuts left spacer region 678a of cell 650.

According to certain aspects, method 500 may be used to identify adjacent cells having spacer regions between them that can be removed (e.g., to allow at least one lateral node from either of the adjacent cells to provide, for the adjacent dummy transistors of these cells, a MOL layer connection to a corresponding power rail). As a result, the size of the integrated circuit may be reduced. For example, if either upper right node 620*b* or upper left node 670*a* is connected to upper power rail 616, and either lower right node 620*d* or lower left node 670*c* is connected to lower power rail 618, then the node connected to upper power rail 616 can provide a MOL layer connection for both upper right dummy transistor 622*b* and upper left dummy transistor 672*a* while the node connected to lower power rail 618 can provide a MOL layer connection for both lower right dummy transistor 622*d* and lower left dummy transistor 672*c*. As a result, right spacer region 628*b* and left spacer region 678*a* can be removed, upper right dummy transistor 622*b* can be merged with upper left dummy transistor 672*a* into a single upper dummy transistor, and lower right dummy transistor 622*d* can be merged with lower left dummy transistor 672*c* into a single lower dummy transistor, thereby decreasing the collective width of cells 600 and 650. Thus, according to certain aspects, method 500 provides a way to identify a connection pattern (between the adjacent lateral nodes of adjacent cells and the power rails) that would allow the spacer regions to be removed so that MOL layer connections provided by the adjacent lateral nodes can be shared between the adjacent cells.

According to certain aspects, method 500 includes identifying a connection pattern of adjacent ones of the first set of cells (S504). For example, the connection pattern of cells 600 and 650 may be between (i) upper right node 620*b*, lower right node 620*d*, upper left node 670*a*, and/or lower left node 670*c* and (ii) at least one of upper power rail 616 and lower power rail 618. In one or more implementations, the connection pattern is a connection configuration that allows the adjacent spacer regions (e.g., right spacer region 628*b* and left spacer region 678*a*) to be removed so that the adjacent lateral nodes (e.g., upper right node 620*b*, lower right node 620*d*, upper left node 670*a*, and/or lower left node 670*c*) of the adjacent cells can be used to provide MOL layer connections. According to certain aspects, the connection pattern of cells 600 and 650 may include (a) a connection of at least one of upper right node 620*b* and upper left node 670*a* to upper power rail 616 and (b) a connection of at least one of lower right node 620*d* and lower left node 670*c* to lower power rail 618. In other words, if either upper right node 620*b* or upper left node 670*a* connects to upper power rail 616, and either lower right node 620*d* or lower left node 670*c* connects to lower power rail 618, then the connection pattern of cells 600 and 650 is formed.

Figure 7A:
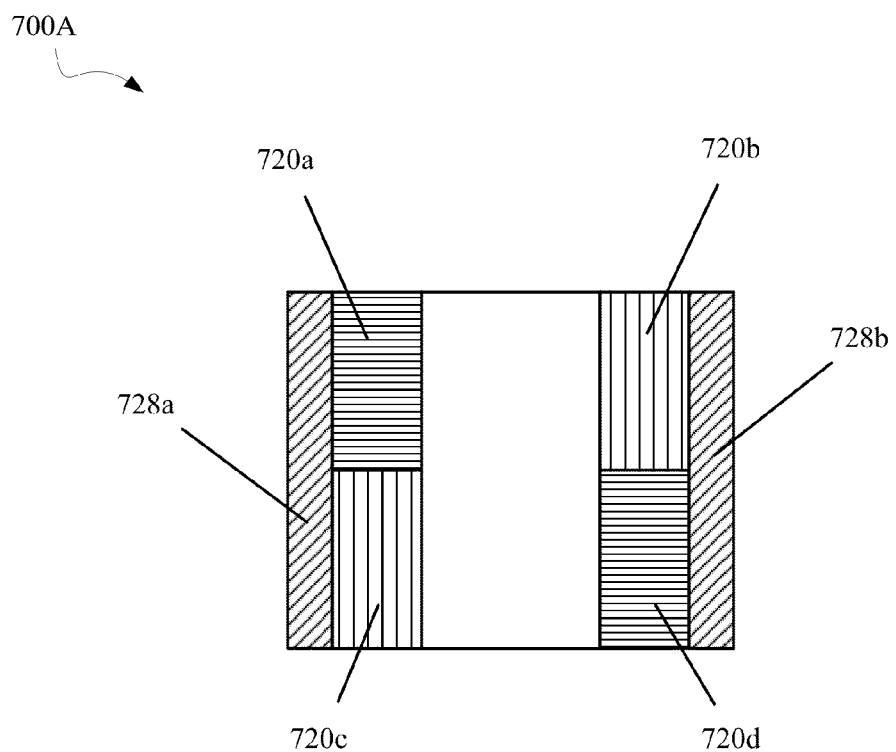
Figure 7A:
Figure 7A:

The connection pattern of adjacent cells can be identified by examining the topologies of the adjacent cells, and determining which of the adjacent lateral nodes of the adjacent cells are connected to corresponding power rails. FIGS. 7A, 7B, 7C, 7D, 7E, 7F, 7G, 7H, 7I, and 7J illustrate examples of cells with different topologies that indicate which lateral nodes of the cells are connected to corresponding power rails, in accordance with various aspects of the subject technology. For example, FIG. 7A illustrates cell 700A having upper left node 720*a*, upper right node 720*b*, lower left node 720*c*, lower right node 720*d*, left spacer region 728*a*, and right spacer region 728*b*. As shown, upper left node 720*a* and lower right node 720*d* are not connected to corresponding power rails (e.g., upper left node 720*a* is not connected to an upper power rail (not shown) while lower right node 720*d* is not connected to a lower power rail (not shown)). Furthermore, upper right node 720*b* and lower left node 720*c* are connected to corresponding power rails (e.g., upper right node 720*b* is connected to the upper power rail while lower left node 720*c* is connected to the lower power rail).

Figures 7H, 7I, 7J:
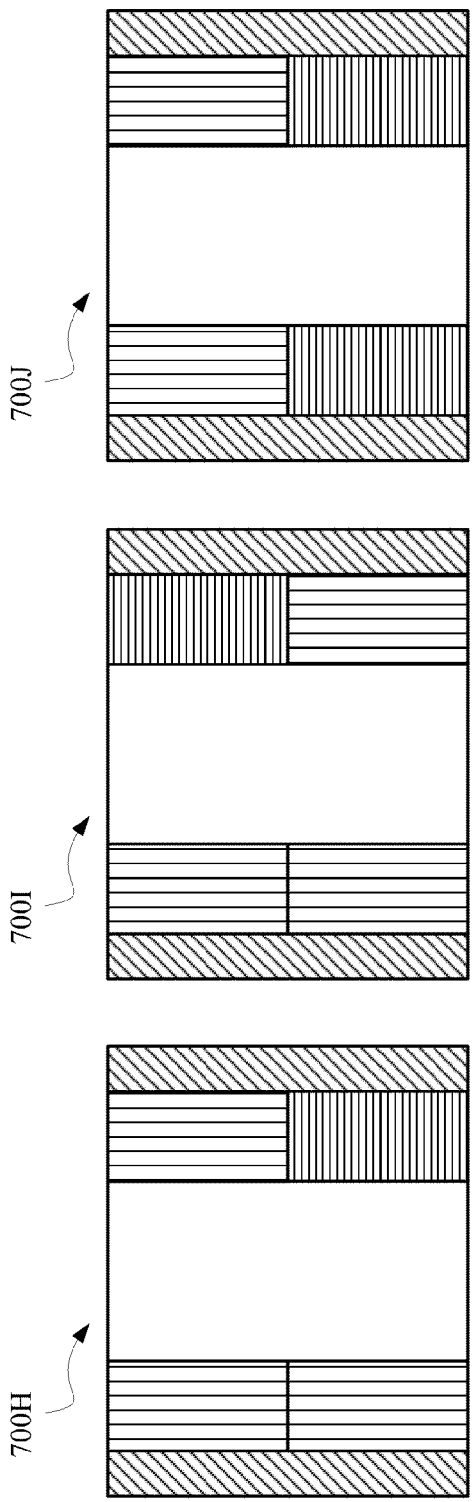

Similarly, FIGS. 7B, 7C, 7D, 7E, 7F, 7G, 7H, 7I, and 7J illustrate cells with different topologies. For example, FIG. 7B illustrates cell 700B in which none of its lateral nodes are connected to power rails. Cell 700B, for example, may represent a flip flop circuit. FIG. 7C illustrates cell 700C in which only its lower right node is connected to a power rail. Cell 700C, for example, may represent an AND circuit. FIG. 7D illustrates cell 700D in which only its upper right node is connected to a power rail. Cell 700D, for example, may represent a NAND circuit. FIG. 7E illustrates cell 700E in which only its lower nodes are connected to a power rail. Cell 700E, for example, may represent an AND-OR-Inverter circuit. FIG. 7F illustrates cell 700F in which only its right nodes are connected to a power rail. Cell 700F, for example, may represent an inverter circuit. FIG. 7G illustrates cell 700G in which all of its lateral nodes are connected to a power rail. Cell 700G, for example, may represent another inverter circuit. FIG. 7H illustrates cell 700H in which only its lower right node is not connected to a power rail. Cell 700H, for example, may represent another NAND circuit. FIG. 7I illustrates cell 700I in which only its upper right node is not connected to a power rail. Cell 700I, for example, may represent a NOR circuit. FIG. 7J illustrates cell 700J in which only its upper nodes are connected to a power rail. Cell 700J, for example, may represent an OR-AND-Inverter circuit. Although FIGS. 7A, 7B, 7C, 7D, 7E, 7F, 7G, 7H, 7I, and 7J illustrate only ten possible topologies of a cell, it is understood that aspects of the subject technology may include other topologies (e.g., the inverted topologies of cells 700A, 700B, 700C, 700D, 700E, 700F, 700G, 700H, 700I, and 700J).

As discussed above, the connection pattern of adjacent cells can be identified by examining the topologies of the adjacent cells, and determining which of the adjacent lateral nodes of the adjacent cells are connected to corresponding power rails. In particular, if at least one of the upper adjacent edge nodes is connected to a power rail and at least one of the lower adjacent edge nodes is connected to a power rail, then the connection pattern of the adjacent cells is formed and therefore can be identified. Otherwise, the connection pattern of the adjacent cells is not formed and therefore is not identified. For example, if the right side of cell 700B is adjacent to the left side of cell 700G, then the connection pattern may be identified (e.g., the upper left node and the lower left node of cell 700G may provide shared MOL layer connections to an upper power rail and a lower power rail for adjacent dummy transistors of both cells 700B and 700G). As another example, if the right side of cell 700C is adjacent to the left side of cell 700J, then the connection pattern may be identified (e.g., the lower right node of cell 700C and the upper left node of cell 700J may provide shared MOL layer connections to the upper power rail and the lower power rail for adjacent dummy transistors of both cells 700C and 700J). In contrast, if the right side of cell 700H is adjacent to the left side of cell 700J, then the connection pattern is not identified (e.g., although the upper right node of cell 700H or the upper left node of cell 700J may provide a shared MOL layer connection to the upper power rail for adjacent dummy transistors of both cells 700H and 700J, neither the lower right node of cell 700H nor the lower left node of cell 700J may provide a shared MOL layer connection to the lower power rail for adjacent dummy transistors of both cells 700H and 700J).

Once the connection pattern of two adjacent cells is identified, the spacer regions between the adjacent cells can be removed. Returning to FIG. 5, method 500 further includes removing adjacent boundary regions of the adjacent cells based on the identified connection pattern of the adjacent cells (S506). For example, right spacer region 628b and left spacer region 678a, as shown in FIG. 6A, can be removed. Furthermore, method 500 includes modifying an arrangement of adjacent dummy transistors of the adjacent cells based on the removal of the adjacent boundary regions (S508). According to certain aspects, modifying the arrangement of the adjacent dummy transistors comprises positioning the adjacent cells to be closer to one another. In one or more implementations, positioning the adjacent cells in this manner comprises merging the adjacent dummy transistors together.

Figure 6B:
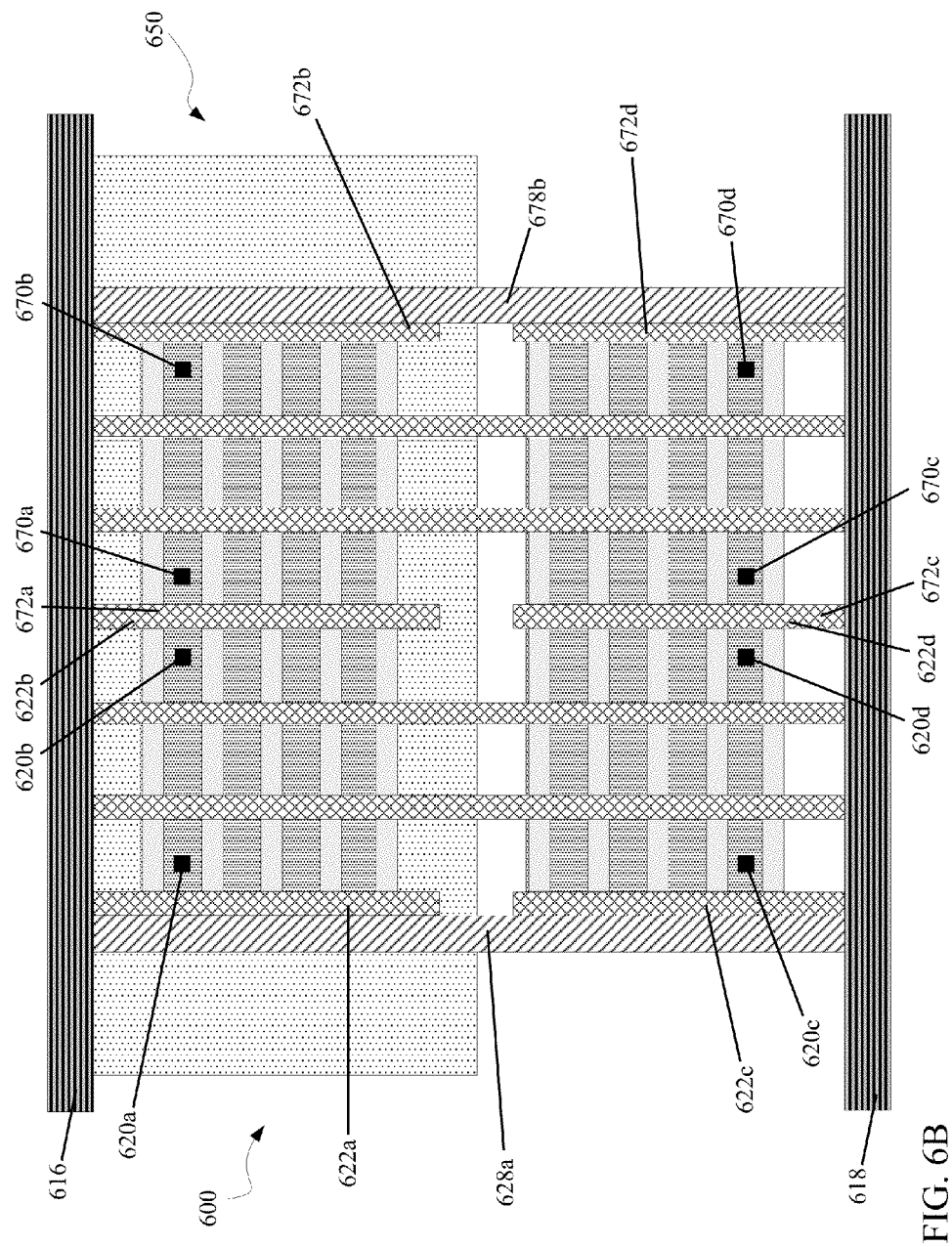

FIG. 6B illustrates an example of cells 600 and 650 after right spacer region 628b and left spacer region 678a (e.g., as shown in FIG. 6A) has been removed, after upper right dummy transistor 622b is merged with upper left dummy transistor 672a into a single upper dummy transistor, and after lower right dummy transistor 622d is merged with lower left dummy transistor 672c into a single lower dummy transistor, in accordance with various aspects of the subject technology. With the spacer regions removed and the adjacent dummy transistors merged together, the collective width of cells 600 and 650 is reduced compared to when the spacer regions were not removed and when the adjacent dummy transistors were not merged together (e.g., as shown in FIG. 6A). Furthermore, cells 600 and 650 can be isolated from one another by connecting the merged upper dummy transistor to upper power rail 616 via a MOL layer connection (e.g., using whichever one of upper right node 620b or upper left node 670a is connected to upper power rail 616) and by connecting the merged lower dummy transistor to lower power rail 618 via a MOL layer connection (e.g., using whichever one of lower right node 620d or lower left node 670c is connected to lower power rail 618).

Thus, aspects of the subject technology provide a method to identify adjacent cells having a connection pattern that would allow adjacent spacer regions of the adjacent cells to be removed and allow adjacent dummy transistors of the adjacent cells to be merged together in order to reduce the collective width of the adjacent cells. However, if the adjacent cells do not have a connection pattern, aspects of the subject technology also provide a method to determine if inverting at least one of the adjacent cells would result in a connection pattern being formed for the adjacent cells after the inverting (e.g., assuming that the inverting would not remove a previous connection pattern of the non-inverted adjacent cells with other cells).

For example, referring to FIGS. 7C and 7D, if the right side of cell 700C is adjacent to the left side of cell 700D, then a connection pattern for cells 700C and 700D is not formed (e.g., because a connection to an upper power rail is lacking). However, if cell 700D is inverted about its vertical axis, the upper left node of inverted cell 700D will be connected to the upper power rail. Thus, if the right side of cell 700C is adjacent to the left side of inverted cell 700D, then a connection pattern for cell 700C and inverted cell 700D is formed (e.g., the upper left node of inverted cell 700D may provide a MOL layer connection to the upper power rail while the lower right node of cell 700C may provide a MOL layer connection to a lower power rail). However, according to one or more implementations, if non-inverted cell 700D had a previous connection pattern formed on its right side with another adjacent cell, and the inverting of cell 700D would remove that previous connection pattern, then cell 700D may not be inverted to form the connection pattern for cell 700C and inverted cell 700D.

Although the inverting is described with respect to only the right cell of adjacent cells, it is understood that the left cell of the adjacent cells or both adjacent cells may be inverted to form a connection pattern for the two adjacent cells (e.g., without removing previous connection patterns of the non-inverted adjacent cells with other cells).

Similar to the inverting, aspects of the subject technology also provide a method to swap one of the adjacent cells with a different cell (e.g., from a different row or from the same row) if doing so would result in a connection pattern being formed for the swapped-in cell and the non-swapped one of the adjacent cells (e.g., assuming that the swapping would not remove a previous connection pattern of the non-swapped adjacent cells with other cells and/or a previous connection pattern of the cell to be swapped in with other cells). According to one or more implementations, only cells having the same height may be swapped with one another.

According to various aspects of the subject technology, after cells have been arranged in rows and/or columns, each pair of adjacent cells may be examined to identify a connection pattern of each pair of adjacent cells so that the corresponding adjacent spacer regions can be removed as described above (e.g., method 500). If connection patterns are not identified and/or if adjacent cells having adjacent spacer regions remain, these cells may be examined again to determine whether inverting and/or swapping any of these cells as described above would form additional connection patterns that would allow for the removal of additional spacer regions between these cells. If so, the inverting and/or swapping may be performed. These cells may continue to be examined and the inverting and/or swapping may continue to be performed until additional connection patterns would not be formed by the inverting and/or the swapping.

Figure 8:
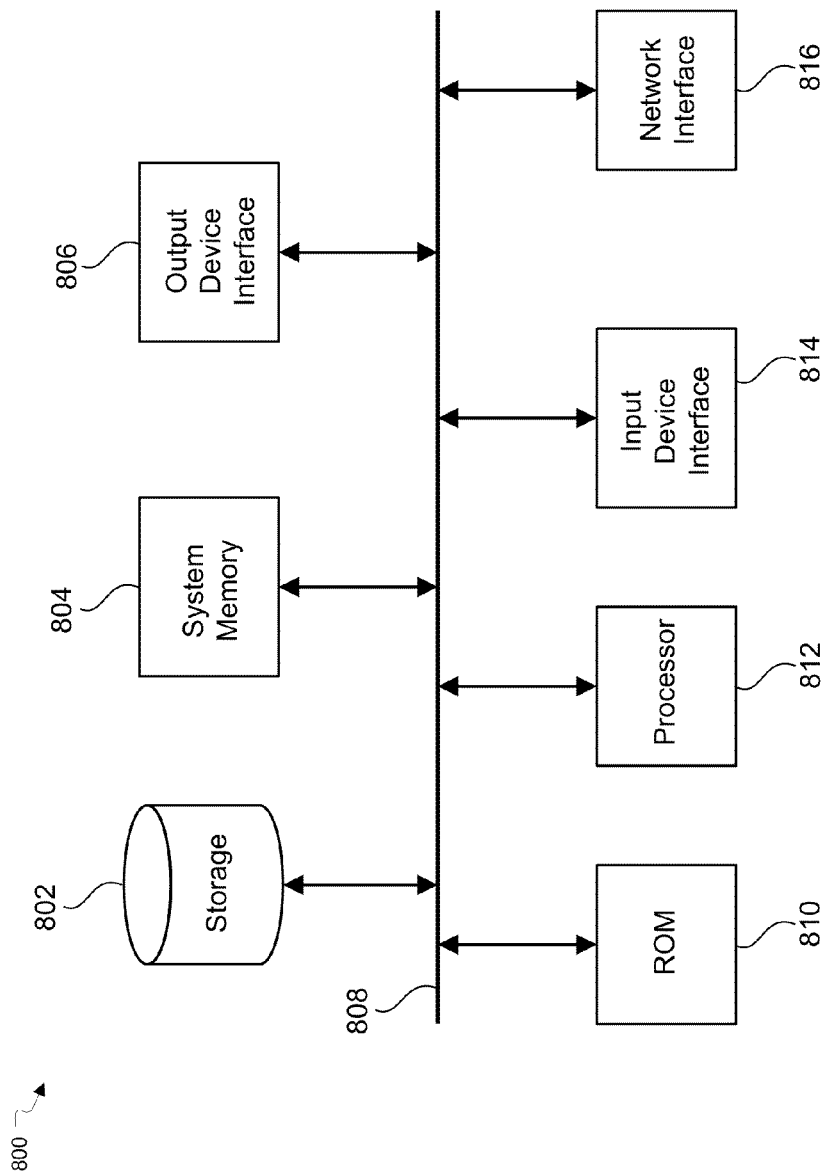
FIG. 8 conceptually illustrates an electronic system with which implementations of the subject technology may be implemented.

FIG. 8 conceptually illustrates electronic system 800 with which implementations of the subject technology may be implemented. Electronic system 800, for example, can be a desktop computer, a laptop computer, a tablet computer, a server, a phone, a personal digital assistant (PDA), any device that can be used to form an integrated circuit using a standard cell library, or generally any electronic device that transmits signals over a network. Such an electronic system includes various types of computer readable media and interfaces for various other types of computer readable media. Electronic system 800 includes bus 808, processing unit(s) 812, system memory 804, read-only memory (ROM) 810, permanent storage device 802, input device interface 814, output device interface 806, and network interface 816, or subsets and variations thereof. The processing unit(s) can be a single processor or a multi-core processor in different implementations.

Bus 808 collectively represents all system, peripheral, and chipset buses that communicatively connect the numerous internal devices of electronic system 800. In one or more implementations, bus 808 communicatively connects processing unit(s) 812 with ROM 810, system memory 804, and permanent storage device 802. From these various memory units, processing unit(s) 812 retrieves instructions to execute and data to process in order to execute the processes of the subject disclosure. In one or more implementations, the method of forming an integrated circuit using a standard cell library (e.g., standard cell library 150 as shown in FIG. 1) as described herein can be implemented by processing unit(s) 812 executing processor-executable instructions that are stored on one or more of the memory units. For example, the standard cell library, in addition to design tools to design the integrated circuit (e.g., specification tools 110, synthesis tools 120, placement/routing tools 130, and/or verification tools 140 as shown in FIG. 1) can be stored as processor-executable instructions on one or more of the memory units for execution by the processing unit(s) 812 to form the integrated circuit.

ROM 810 stores static data and instructions that are needed by processing unit(s) 812 and other modules of the electronic system. Permanent storage device 802, on the other hand, is a read-and-write memory device. This device is a non-volatile memory unit that stores instructions and data even when electronic system 800 is off. One or more implementations of the subject disclosure use a mass-storage device (such as a magnetic or optical disk and its corresponding disk drive) as permanent storage device 802.

Other implementations use a removable storage device (such as a floppy disk, flash drive, and its corresponding disk drive) as permanent storage device 802. Like permanent storage device 802, system memory 804 is a read-and-write memory device. However, unlike storage device 802, system memory 804 is a volatile read-and-write memory, such as random access memory. System memory 804 stores any of the instructions and data that processing unit(s) 812 needs at runtime. In one or more implementations, the processes of the subject disclosure are stored in system memory 804, permanent storage device 802, and/or ROM 810. From these various memory units, processing unit(s) 812 retrieves instructions to execute and data to process in order to execute the processes of one or more implementations.

Bus 808 also connects to input and output device interfaces 814 and 806. Input device interface 814 enables a user to communicate information and select commands to the electronic system. Input devices used with input device interface 814 include, for example, alphanumeric keyboards and pointing devices (also called "cursor control devices"). Output device interface 806 enables, for example, the display of images generated by electronic system 800. Output devices used with output device interface 806 include, for example, printers and display devices, such as a liquid crystal display (LCD), a light emitting diode (LED) display, an organic light emitting diode (OLED) display, a flexible display, a flat panel display, a solid state display, a projector, or any other device for outputting information. One or more implementations may include devices that function as both input and output devices, such as a touchscreen. In these implementations, feedback provided to the user can be any form of sensory feedback, such as visual feedback, auditory feedback, or tactile feedback; and input from the user can be received in any form, including acoustic, speech, or tactile input.

Finally, as shown in FIG. 8, bus 808 also couples electronic system 800 to a network (not shown) through network interface 816. In this manner, the computer can be a part of a network of computers (such as a local area network ("LAN"), a wide area network ("WAN"), or an Intranet, or a network of networks, such as the Internet. Any or all components of electronic system 800 can be used in conjunction with the subject disclosure.

Many of the above-described features and applications may be implemented as software processes that are specified as a set of instructions recorded on a computer readable storage medium (alternatively referred to as computer-readable media, machine-readable media, or machine-readable storage media). When these instructions are executed by one or more processing unit(s) (e.g., one or more processors, cores of processors, or other processing units), they cause the processing unit(s) to perform the actions indicated in the instructions. Examples of computer readable media include, but are not limited to, RAM, ROM, read-only compact discs (CD-ROM), recordable compact discs (CD-R), rewritable compact discs (CD-RW), read-only digital versatile discs (e.g., DVD-ROM, dual-layer DVD-ROM), a variety of recordable/rewritable DVDs (e.g., DVD-RAM, DVD-RW, DVD+RW, etc.), flash memory (e.g., SD cards, mini-SD cards, micro-SD cards, etc.), magnetic and/or solid state hard drives, ultra density optical discs, any other optical or magnetic media, and floppy disks. In one or more implementations, the computer readable media does not include carrier waves and electronic signals passing wirelessly or over wired connections, or any other ephemeral signals. For example, the computer readable media may be entirely restricted to tangible, physical objects that store information in a form that is readable by a computer. In one or more implementations, the computer readable media is non-transitory computer readable media, computer readable storage media, or non-transitory computer readable storage media.

In one or more implementations, a computer program product (also known as a program, software, software application, script, or code) can be written in any form of programming language, including compiled or interpreted languages, declarative or procedural languages, and it can be deployed in any form, including as a stand alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

While the above discussion primarily refers to microprocessor or multi-core processors that execute software, one or more implementations are performed by one or more integrated circuits, such as application specific integrated circuits (ASICs) or field programmable gate arrays (FPGAs). In one or more implementations, such integrated circuits execute instructions that are stored on the circuit itself.

Those of skill in the art would appreciate that the various illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

As used in this specification and any claims of this application, the terms "computer", "server", "processor", and "memory" all refer to electronic or other technological devices. These terms exclude people or groups of people. For the purposes of the specification, the terms "display" or "displaying" means displaying on an electronic device.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

The predicate words "configured to", "operable to", and "programmed to" do not imply any particular tangible or intangible modification of a subject, but, rather, are intended to be used interchangeably. In one or more implementations, a processor configured to analyze and control an operation or a component may also mean the processor being programmed to analyze and control the operation or the processor being operable to analyze and control the operation. Likewise, a processor configured to execute code can be construed as a processor programmed to execute code or operable to execute code.

Terms such as "upper," "lower," "right," "left" and the like as used in this disclosure, if any, should be understood as referring to an arbitrary frame of reference, rather than to the ordinary gravitational frame of reference. Thus, an upper surface, a lower surface, a right surface, and a left surface may extend upwardly, downwardly, diagonally, or horizontally in a gravitational frame of reference.

A phrase such as "an aspect" does not imply that such aspect is essential to the subject technology or that such aspect applies to all configurations of the subject technology. A disclosure relating to an aspect may apply to all configurations, or one or more configurations. An aspect may provide one or more examples of the disclosure. A phrase such as an "aspect" may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples of the disclosure. A phrase such an "embodiment" may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples of the disclosure. A phrase such as a "configuration" may refer to one or more configurations and vice versa.

The word "exemplary" is used herein to mean "serving as an example, instance, or illustration." Any embodiment described herein as "exemplary" or as an "example" is not necessarily to be construed as preferred or advantageous over other embodiments. Furthermore, to the extent that the term "include," "have," or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. A method for forming an integrated circuit using a standard cell library, the method comprising:
   retrieving the standard cell library from memory,
   arranging a first set of cells from the standard cell library into a first row between an upper power rail and a lower power rail, each of the cells comprising a plurality of lateral nodes, at least one boundary region adjacent to the plurality of lateral nodes, and at least one dummy transistor disposed between the plurality of lateral nodes and the at least one boundary region;
   identifying a connection pattern of adjacent ones of the first set of cells, the connection pattern being between (i) the plurality of lateral nodes of the adjacent cells and (ii) the upper power rail and the lower power rail;
   removing adjacent boundary regions of the adjacent cells based on the identified connection pattern of the adjacent cells; and
   modifying an arrangement of adjacent dummy transistors of the adjacent cells based on the removal of the adjacent boundary regions.

2. The method of claim 1,
   wherein the plurality of lateral nodes of each of the cells comprises an upper left node, an upper right node, a lower left node, and a lower right node,
   wherein the at least one boundary region of each of the cells comprises a right spacer region and a left spacer region,
   wherein the right spacer region is adjacent and peripheral to the upper right node and the lower right node,
   wherein the left spacer region is adjacent and peripheral to the upper left node and the lower left node, and
   wherein the connection pattern of the adjacent cells comprises:
   (a) a connection of at least one of the upper right node of one of the adjacent cells and the upper left node of the other of the adjacent cells to the upper power rail; and
   (b) a connection of at least one of the lower right node of one of the adjacent cells and the lower left node of the other of the adjacent cells to the lower power rail.

3. The method of claim 2,
   wherein the adjacent cells comprise a first cell and a second cell,
   wherein the adjacent boundary regions comprise the right spacer region of the first cell and the left spacer region of the second cell, and
   wherein the connection pattern of the first cell and the second cell comprises:

(a) a connection of at least one of the upper right node of the first cell and the upper left node of the second cell to the upper power rail; and (b) a connection of at least one of the lower right node of the first cell and the lower left node of the second cell to the lower power rail.

4. The method of claim 3, wherein if the connection pattern of the first cell and the second cell is not identified, the method further comprises determining whether inverting at least one of the first cell and the second cell would result in a connection pattern of the inverted at least one of the first cell and the second cell without removing at least one of:

(c) a previous connection pattern of the non-inverted first cell and a third one of the first set of cells adjacent to the non-inverted first cell; and (d) a previous connection pattern of the non-inverted second cell and a fourth one of the first set of cells adjacent to the non-inverted second cell.

5. The method of claim 4, wherein the inverting is about a vertical axis perpendicular to a longitudinal axis of the first row.

6. The method of claim 4, further comprising the inverting, the inverting resulting in the connection pattern of the inverted at least one of the first cell and the second cell without removing at least one of:

(c) the previous connection pattern of the non-inverted first cell and the third cell; and (d) the previous connection pattern of the non-inverted second cell and the fourth cell.

7. The method of claim 3, further comprising arranging a second set of the cells from the standard cell library into a second row between a second upper power rail and a second lower power rail.

8. The method of claim 7, wherein if the connection pattern of the first cell and the second cell is not identified, the method further comprises determining whether swapping the first cell or the second cell with a third one of the second set of cells would result in a connection pattern of the swapped third cell and the non-swapped one of the first cell and the second cell without removing at least one of:

(c) a previous connection pattern of the non-swapped first cell and a fourth one of the first set of cells adjacent to the non-swapped first cell;

(d) a previous connection pattern of the non-swapped second cell and a fifth one of the first set of cells adjacent to the non-swapped second cell;

(e) a previous connection pattern of the non-swapped third cell and a sixth one of the second set of cells adjacent to the non-swapped third cell; and (f) a previous connection pattern of the non-swapped third cell and a seventh one of the second set of cells adjacent to the non-swapped third cell.

9. The method of claim 8, further comprising the swapping, the swapping resulting in the connection pattern of the swapped third cell and the non-swapped one of the first cell and the second cell without removing at least one of:

(c) the previous connection pattern of the non-swapped first cell and the fourth cell;

(d) the previous connection pattern of the non-swapped second cell and the fifth cell;

(e) the previous connection pattern of the non-swapped third cell and the sixth cell; and (f) the previous connection pattern of the non-swapped third cell and the seventh cell.

10. The method of claim 3, wherein the at least one dummy transistor of each of the cells comprises an upper left dummy transistor disposed between the left spacer region and the upper left node, an upper right dummy transistor disposed between the right spacer region and the upper right node, a lower left dummy transistor disposed between the left spacer region and the lower left node, and a lower right dummy transistor disposed between the right spacer region and the lower right node.

11. The method of claim 10, wherein modifying the arrangement of the adjacent dummy transistors comprises positioning the first cell and the second cell to be closer to one another.

12. The method of claim 11, wherein positioning the first cell and the second cell comprises:

merging the upper right dummy transistor of the first cell and the upper left dummy transistor of the second cell into a single upper dummy transistor; and merging the lower right dummy transistor of the first cell and the lower left dummy transistor of the second cell into a single lower dummy transistor.

13. The method of claim 12, further comprising:

connecting the single upper dummy transistor to at least one of the upper right node of the first cell and the upper left node of the second cell that is connected to the upper power rail; and connecting the single lower dummy transistor to at least one of the lower right node of the first cell and the lower left node of the second cell that is connected to the lower power rail.

14. The method of claim 2, wherein a width of the right spacer region is half of a spacing between adjacent gate electrodes of each of the cells, and wherein a width of the left spacer region is half of the spacing between adjacent gate electrodes of each of the cells.

15. The method of claim 1, wherein each of the cells comprises a plurality of fin-based metal-oxide-semiconductor field-effect transistors (finFETs).

16. An integrated circuit comprising a plurality of adjacent cells formed based on a standard cell library, each cell of the plurality of adjacent cells comprising:

a plurality of p-type transistors formed in an N-well;

a plurality of n-type transistors;

a plurality of lateral nodes forming drains or sources of the plurality of p-type and n-type transistors; and at least one dummy transistor disposed between the plurality of lateral nodes and at least one boundary region, wherein:

an arrangement of adjacent dummy transistors of the adjacent cells is based on a modified arrangement of adjacent dummy transistors of the adjacent cells of the cell library, which is based on removal of adjacent boundary regions of the adjacent cells based on an identified connection pattern of the adjacent cells, and the identified connection pattern of the adjacent cells is between (i) the plurality of lateral nodes of the adjacent cells and (ii) the upper power rail and the lower power rail.

17. The integrated circuit of claim 16, wherein the plurality of p-type transistors are formed by a first set of parallel fins and multiple gate regions that extend between an upper and a lower power rail, wherein the plurality of p-type transistors are formed by a second set of parallel fins and the multiple gate regions, the first and the second set of parallel fins are formed in parallel to the upper and lower power wells, and the gate regions are formed perpendicular to the fins and lower power wells and cover portions of the first and the second set of parallel fins.

18. The integrated circuit of claim 16, wherein each of the p-type transistor and the n-type transistor comprises a fin-based metal-oxide-semiconductor field-effect transistor (fin-FET).

19. A system comprising:
memory; and
one or more processors configured to execute a set of instructions stored in the memory to implement a method of forming an integrated circuit using a standard cell library, the method comprising:
arranging a first set of cells from the standard cell library into a first row between an upper power rail and a lower power rail, each of the cells comprising:
an upper left node;
an upper right node;
a lower left node;
a lower right node;
a right spacer region adjacent and peripheral to the upper right node and the lower right node;
a left spacer region adjacent and peripheral to the upper left node and the lower left node;
an upper left dummy transistor disposed between the left spacer region and the upper left node;
an upper right dummy transistor disposed between the right spacer region and the upper right node;
a lower left dummy transistor disposed between the left spacer region and the lower left node; and
a lower right dummy transistor disposed between the right spacer region and the lower right node;
identifying a connection pattern of a first one of the first set of cells and a second one of the first set of cells, the right spacer region of the first cell being adjacent to the left spacer region of the second cell, the connection pattern of the first cell and the second cell comprising:

(a) a connection of at least one of the upper right node of the first cell and the upper left node of the second cell to the upper power rail; and
(b) a connection of at least one of the lower right node of the first cell and the lower left node of the second cell to the lower power rail;
removing the right spacer region of the first cell and the left spacer region of the second cell based on the identified connection pattern of the first cell and the second cell; and
modifying an arrangement of the upper right dummy transistor of the first cell, the upper left dummy transistor of the second cell, the lower right dummy transistor of the first cell, and the lower left dummy transistor of the second cell based on the removal of the right spacer region of the first cell and the left spacer region of the second cell.

20. The system of claim 19, wherein modifying the arrangement comprises positioning the first cell and the second cell to be closer to one another.

21. An integrated circuit comprising:
a plurality of adjacent cells formed based on a standard cell library, each cell of the plurality of adjacent cells comprising a plurality of p-type and n-type transistors and a plurality of lateral nodes forming drains or a sources of the plurality of p-type and n-type transistors and formed in a first row between an upper power rail and a lower power rail; and
at least one dummy transistor disposed between the plurality of lateral nodes and at least one boundary region,
wherein adjacent dummy transistors of the adjacent cells are arranged based on a modified arrangement of adjacent dummy transistors of the adjacent cells of the cell library, in which adjacent boundary regions of the adjacent cells are removed based on an identified connection pattern between the plurality of lateral nodes of the adjacent cells and upper and lower power rails.

* * * * *